(12) United States Patent
Yamada et al.

(10) Patent No.: US 11,101,234 B2
(45) Date of Patent: Aug. 24, 2021

(54) CU PILLAR CYLINDRICAL PREFORM FOR SEMICONDUCTOR CONNECTION

(71) Applicants: NIPPON MICROMETAL CORPORATION, Saitama (JP); NIPPON STEEL CHEMICAL & MATERIAL CO., LTD., Tokyo (JP)

(72) Inventors: Takashi Yamada, Saitama (JP); Daizo Oda, Saitama (JP); Teruo Haibara, Saitama (JP); Shinichi Terashima, Tokyo (JP)

(73) Assignees: NIPPON MICROMETAL CORPORATION, Saitama (JP); NIPPON STEEL CHEMICAL & MATERIAL CO., LTD., Tokyo (JP)

( * ) Notice: Subject to any disclaimer, the term of this patent is extended or adjusted under 35 U.S.C. 154(b) by 0 days.

(21) Appl. No.: 15/506,956

(22) PCT Filed: Aug. 28, 2015

(86) PCT No.: PCT/JP2015/074525
§ 371 (c)(1),
(2) Date: Feb. 27, 2017

(87) PCT Pub. No.: WO2016/031989
PCT Pub. Date: Mar. 3, 2016

(65) Prior Publication Data
US 2017/0287861 A1 Oct. 5, 2017

(30) Foreign Application Priority Data

Aug. 29, 2014 (JP) .............................. JP2014-175507

(51) Int. Cl.
*H01L 23/00* (2006.01)
*H01L 23/50* (2006.01)
(Continued)

(52) U.S. Cl.
CPC .............. *H01L 24/13* (2013.01); *B23K 1/008* (2013.01); *B23K 1/0016* (2013.01); *B23K 1/19* (2013.01);
(Continued)

(58) Field of Classification Search
CPC . H01L 2224/13564; H01L 2224/13639; H01L 2224/13611; H01L 24/13;
(Continued)

(56) References Cited

U.S. PATENT DOCUMENTS 6,648,211 B2 11/2003 Saiki et al.
7,348,270 B1 * 3/2008 Danovitch .......... H01L 21/6835
438/613
(Continued)

FOREIGN PATENT DOCUMENTS

CN 1817538 A 8/2006
CN 102459668 A 5/2012
(Continued)

OTHER PUBLICATIONS

NPL-Machine translation of Ueda (Kyocera Corp on IDS), JP2003-249598, translation done Aug. 7, 2017.*
(Continued)

*Primary Examiner* — David Sample
*Assistant Examiner* — Elizabeth Collister
(74) *Attorney, Agent, or Firm* — McDermott Will & Emery LLP

(57) ABSTRACT

A material for Cu pillars is formed as cylindrical preforms in advance and connecting these cylindrical preforms to electrodes on a semiconductor chip to form Cu pillars. Due to this, it becomes possible to make the height/diameter ratio of the Cu pillars 2.0 or more. Since electroplating is not used, the time required for production of the Cu pillars is short and the productivity can be improved. Further, the (Continued)

height of the Cu pillars can be raised to 200 µm or more, so these are also preferable for moldunderfill. The components can be freely adjusted, so it is possible to easily design the alloy components to obtain highly reliable Cu pillars.

10 Claims, 2 Drawing Sheets

(51) Int. Cl.
*C22C 9/00* (2006.01)
*H01L 23/12* (2006.01)
*B23K 1/008* (2006.01)
*B23K 1/00* (2006.01)
*B23K 1/19* (2006.01)
*B23K 101/38* (2006.01)
*B23K 103/12* (2006.01)
*B23K 101/42* (2006.01)

(52) U.S. Cl.
CPC .............. *C22C 9/00* (2013.01); *H01L 23/12* (2013.01); *H01L 23/50* (2013.01); *H01L 24/11* (2013.01); *B23K 2101/38* (2018.08); *B23K 2101/42* (2018.08); *B23K 2103/12* (2018.08); *H01L 2224/1111* (2013.01); *H01L 2224/1134* (2013.01); *H01L 2224/11334* (2013.01); *H01L 2224/13005* (2013.01); *H01L 2224/13014* (2013.01); *H01L 2224/1357* (2013.01); *H01L 2224/13147* (2013.01); *H01L 2224/13564* (2013.01); *H01L 2224/13611* (2013.01); *H01L 2224/13639* (2013.01); *H01L 2924/01015* (2013.01); *H01L 2924/01016* (2013.01); *H01L 2924/01017* (2013.01); *H01L 2924/01022* (2013.01); *H01L 2924/01028* (2013.01); *H01L 2924/01046* (2013.01); *H01L 2924/01078* (2013.01); *H01L 2924/01079* (2013.01)

(58) Field of Classification Search
CPC ........... H01L 24/11; H01L 2224/13147; H01L 2924/01022; H01L 2924/01079; H01L 2924/01078; H01L 2924/01017; H01L 2224/1357; H01L 2224/1111; H01L 2224/13014; H01L 2924/01015; H01L 2924/01028; H01L 2924/01046; H01L 2924/01016; H01L 23/12; H01L 23/50; H01L 2224/11334; H01L 2224/1134; H01L 2224/13005; B23K 1/0016; B23K 1/008; B23K 1/19; B23K 2201/38; B23K 2201/42; B23K 2203/12; C22C 9/00
USPC ........................................................ 428/577
See application file for complete search history.

(56) References Cited

U.S. PATENT DOCUMENTS

| | | |
|---|---|---|
| 2002/0088844 A1 | 7/2002 | Saiki et al. |
| 2003/0116842 A1* | 6/2003 | Motonami ........ H01L 23/49586 257/692 |
| 2005/0247384 A1* | 11/2005 | Jacobsen .............. B22D 11/108 148/553 |
| 2006/0118604 A1 | 6/2006 | Buchwalter et al. |
| 2006/0186544 A1* | 8/2006 | Won ........................ H01L 24/45 257/741 |
| 2008/0061440 A1* | 3/2008 | Uno ........................ H01L 24/43 257/762 |
| 2008/0073795 A1* | 3/2008 | Kohl ....................... H01L 24/10 257/774 |
| 2008/0203568 A1* | 8/2008 | Tanaka .................... H01L 24/45 257/738 |
| 2011/0001250 A1 | 1/2011 | Lin et al. |
| 2012/0094121 A1* | 4/2012 | Uno ........................ B21C 1/003 428/389 |
| 2013/0025917 A1 | 1/2013 | Chiba et al. |
| 2013/0071969 A1* | 3/2013 | Vodrahalli .......... H01L 25/0657 438/107 |
| 2013/0140068 A1* | 6/2013 | Sarangapani .......... H01B 1/026 174/257 |
| 2013/0140084 A1* | 6/2013 | Sarangapani ............. C22C 9/06 174/94 R |
| 2014/0000932 A1* | 1/2014 | Aoyama ................... C22F 1/08 174/105 R |
| 2014/0209215 A1* | 7/2014 | Chuang .................. H01L 24/45 148/518 |
| 2016/0078980 A1* | 3/2016 | Sarangapani ........ H05K 1/0213 174/250 |

FOREIGN PATENT DOCUMENTS

| | | |
|---|---|---|
| JP | 2003-249598 A | 9/2003 |
| JP | 2011-003745 A | 1/2011 |
| JP | 2011-029636 A | 2/2011 |
| JP | 2012-532459 A | 12/2012 |
| TW | 503546 B | 9/2002 |
| WO | 2011/002778 A3 | 1/2011 |
| WO | 2011/105598 A1 | 9/2011 |

OTHER PUBLICATIONS

Search Report issued in corresponding International Patent Application No. PCT/JP2015/074525, dated Nov. 17, 2015.
Chinese Office Action issued in corresponding Chinese Patent Application No. 201580045029.4, dated Sep. 26, 2018, with English Translation.
Korean Office Action issued in corresponding Korean Patent Application No. 10-2017-7004660, dated Sep. 28, 2018, with English Translation.
Chinese Office Action issued in corresponding Chinese Patent Application No. 201580045029.4, dated Apr. 19, 2019, with English translation.
Taiwanese Office Action issued in Taiwanese Patent Application No. 104128543, dated Mar. 6, 2020, with English translation.

\* cited by examiner (a)

(b)

CU PILLAR CYLINDRICAL PREFORM FOR SEMICONDUCTOR CONNECTION

CROSS REFERENCE

This application is the U.S. National Phase under 35 U.S.C. § 371 of International Application No. PCT/JP2015/074525, filed on Aug. 28, 2015, which claims the benefit of Japanese Application No. 2014-175507, filed on Aug. 29, 2014, the entire contents of each are hereby incorporated by reference.

TECHNICAL FIELD

The present invention relates to a cylindrical preform able to be used as a Cu pillar for a semiconductor connection.

BACKGROUND ART

A semiconductor device is formed by forming electronic circuits on a semiconductor chip and connecting electrodes on the semiconductor chip and electrodes on a semiconductor package. In the past, the electrodes on the semiconductor chip and electrodes on the semiconductor package were electrically connected using Au or Cu bonding wires.

Recently, due to the miniaturization of semiconductor devices, the flip chip method has been used as the method of connection of a semiconductor chip and semiconductor package. As typical connection methods in the flip chip method, Au bumps or solder bumps have been used.

Furthermore, along with the increasingly higher integration of chips, recently the flip chip technique using Cu pillars has been employed. Cu pillars are pillars of Cu formed on a semiconductor chip. The tips of the Cu pillars are connected to the electrodes of the semiconductor package. As Cu pillars, ones of a pillar diameter of 70 μm or less and a pillar height of 50 to 60 μm have been used.

Cu pillars are made of the low electrical resistance Cu, so can handle larger currents compared with solder bumps. Further, Cu pillars enable the amount of supply of solder to be kept down compared with solder bumps, so finer pump pitches become possible. Furthermore, while Au bumps have small contact areas with electrodes, Cu pillars can maintain the same cross-sectional area from the electrodes on the semiconductor chip to the electrodes on the semiconductor package and still can handle larger currents.

As described in PLTs 1 and 2, as the method of forming Cu pillars on a semiconductor chip, the plating method has been used. The semiconductor chip is formed with a photoresist layer, openings are formed at the photoresist layer at the parts for forming the Cu pillars, the open parts are plated with Cu, and the top parts of the plated Cu are plated with solder. The resist is then peeled off whereby the parts plated by Cu become Cu pillars. The parts of the top parts of the Cu pillars plated with solder are used as solder bumps and are connected with the semiconductor package. Since the Cu pillars are formed by plating, it becomes possible to handle demands for finer pitches.

CITATIONS LIST

Patent Literature

PLT 1: Japanese Patent Publication No. 2011-29636A
PLT 2: Japanese Patent Publication No. 2012-532459A

SUMMARY OF INVENTION

Technical Problem

When forming Cu pillars by plating, the method of forming openings in the photoresist layer and plating the open parts with Cu has been used. With such a method, if trying to form elongated Cu pillars with large height/diameter ratios of the Cu pillars, it is necessary to grow the plating in deep holes with small diameters. In this case, it becomes difficult to continue to supply plating solution with a sufficient concentration to the open parts. As a result, the problems arise that (1) the growth of the plating becomes slower and the throughput deteriorates, (2) the Cu pillars become finer in diameter than targeted and the shapes otherwise become unstable, (3) voids form in the deposited Cu and the quality otherwise deteriorates, etc. For these reasons, it was difficult to make the height/diameter ratio of the Cu pillars 2.0 or more.

Since the Cu pillars are formed by plating, the time required for producing the Cu pillars became longer and the productivity was inhibited. If it is possible to make the height of the Cu pillars higher to 200 μm or more, this would be preferable for mold-underfill. However, if trying to make the height of the Cu pillars higher than the conventional 50 to 60 μm, the time required for production would be lengthened.

A semiconductor device used for on-vehicle is required to be reliable under severe conditions (high temperature). To raise the reliability of Cu pillars, it is effective to make the Cu pillars an alloy, but the plating process used for forming the Cu pillars generally deposits a single substance. There is low degree of freedom for alloying.

The present invention has as its objective to increase the height/diameter ratio of the Cu pillars, improve the productivity, enable increase of the height of the Cu pillars, and improve the reliability of the Cu pillars compared with the method of forming Cu pillars by the plating method like in the past when providing Cu pillars on a semiconductor chip and electrically connecting them.

Solution to Problem

In the past, Cu pillars were formed by electroplating. As opposed to this, if forming the material for Cu pillars as cylindrical preforms in advance and connecting the cylindrical preforms to the electrodes on the semiconductor chip, it becomes possible to make the height/diameter ratio of the Cu pillars 2.0 or more. Further, even if the height of the Cu pillars is 200 μm or more, production is possible without impairing the productivity. Furthermore, since the cylindrical preforms are formed from materials obtained by melting an ingot, the components can be freely adjusted.

The present invention was made based on the above discovery and has as its gist the following:

(1) A cylindrical preform having Cu as a main component, satisfying one or more of (a) to (c) among (a) having one or more of Pd, Pt, Au, and Ni in a total of 0.1 to 5.0 mass %, (b) having Ti in 3 to 15 mass ppm, (c) having P in 5 to 150 mass ppm, having a cylindrical shape with a diameter of 50 to 100 μm, having a height/diameter ratio of that cylinder of 2.0 or more, and used as a Cu pillar for a semiconductor connection.

(2) A cylindrical preform having Cu as a main component, having a cylindrical shape with a diameter of 100 to 400 μm, and used as a Cu pillar for a semiconductor connection.

(3) The cylindrical preform according to (2), wherein the cylinder has a height of 200 to 800 μm.
(4) The cylindrical preform according to any one of (1) to (3), further containing one or more of Pd, Pt, Au, and Ni in a total of 5.0 mass % or less in range.
(5) The cylindrical preform according to any one of (1) to (4), further containing Ti in 15 mass ppm or less.
(6) The cylindrical preform according to any one of (1) to (5), further containing P in 150 mass ppm or less.
(7) The cylindrical preform according to any one of (1) to (6), wherein a total of a content of S and a content of Cl contained as impurities is 1 mass ppm or less.

Advantageous Effects of Invention

The present invention forms the material used for the Cu pillars into cylindrical preforms in advance and connects these cylindrical preforms to electrodes of the semiconductor chip and thereby enables the formation of Cu pillars without the use of electroplating. By connecting the cylindrical preforms to electrodes on the semiconductor chip, it becomes possible to make the height/diameter ratio of the Cu pillars 2.0 or more. Further, even if the height of the Cu pillars is 200 μm or more, production is possible without impairing the productivity. An ingot produced by ingot melting is rolled and drawn to form fine wires, then cut to obtain the cylindrical preforms, so it is possible to freely adjust the components at the ingot melting stage. Therefore, it is possible to easily design the alloy components to obtain highly reliable Cu pillars. It is possible to easily produce large diameter Cu pillars, so applications as Cu pillars for large current use (power systems) can be realized.

BRIEF DESCRIPTION OF DRAWINGS

FIG. 2A is a view showing the state of connecting cylindrical preforms of the present invention as Cu pillars to a semiconductor chip, while
FIG. 2B is a view showing the state of further connecting the tips of the Cu pillars to a semiconductor package.

DESCRIPTION OF EMBODIMENTS

Figure 1:
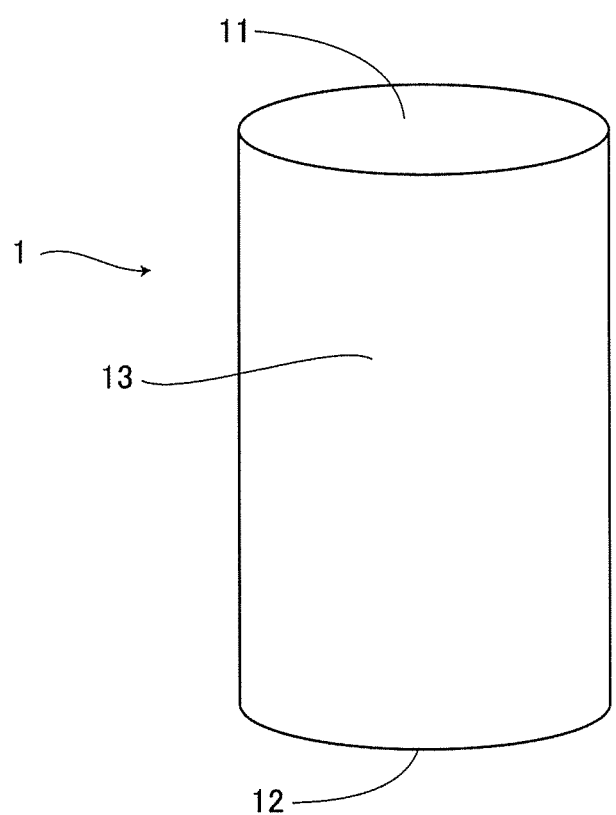
FIG. 1 is a perspective view of a Cu pillar cylindrical preform of the present invention.
Figure 2:
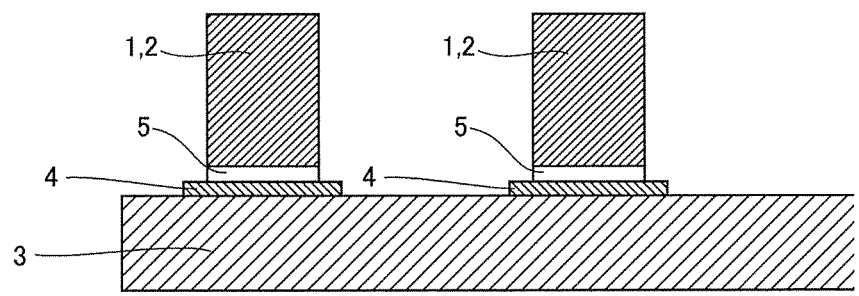
Figure 2:
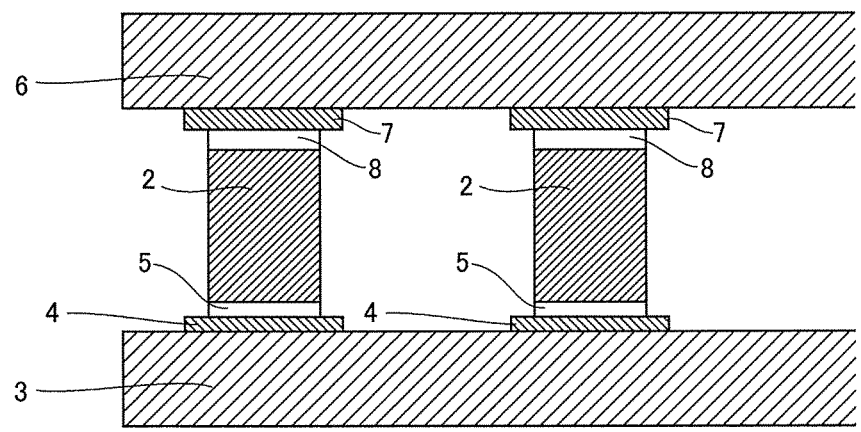

As explained above, in the past, Cu pillars were formed by electroplating.
As opposed to this, the present invention forms the material for the Cu pillars as cylindrical preforms 1 in advance as shown in FIG. 1 and connects the cylindrical preforms 1, as shown in FIG. 2A, to electrodes 4 on the semiconductor chip 3 so as to form Cu pillars 2. For example, it is possible to coat SnAg paste 5 on the electrodes 4 of the semiconductor chip 3, or coat SnAg paste on the end faces of the cylindrical preforms, then arrange the cylindrical preforms 1 of the present invention so that their end faces face and contact the electrodes 4 of the semiconductor chip 3 and raise the temperature to make the SnAg paste 5 reflow and thereby form Cu pillars 2 on the electrodes 4 of the semiconductor chip 3 as shown in FIG. 2A.
Since the material for the Cu pillars is made into cylindrical preforms, it is possible to prepare fine Cu wire of an equal diameter and the same composition of components as the Cu pillars and cut the fine Cu wire to the same height (length) as the targeted height of the Cu pillars so as to easily obtain the targeted cylindrical preforms.

The Cu pillar cylindrical preforms of the present invention in a first aspect are made a diameter of 50 to 100 μm and a cylinder height/diameter ratio of 2.0 or more. If like in the past forming openings in a photoresist layer and plating the open parts with Cu to form Cu pillars, it was difficult to make the height/diameter ratio of the Cu pillars 2.0 or more. As opposed to this, the present invention forms the material for the Cu pillars into cylindrical preforms in advance and connects the cylindrical preforms to electrodes on the semiconductor chip. If doing this, it becomes possible to make the height/diameter ratio of the Cu pillars 2.0 or more. For this reason, even if the Cu pillars have fine diameters of 50 to 100 μm, it is possible to increase the Cu pillars in height. If the Cu pillars have fine diameters of 50 to 100 μm, if overly increasing the Cu pillars in height/diameter ratio, the connection precision falls and the problem arises of the probability of poor connection occurring rising, but if the height/diameter ratio is 8.0 or less, such a problem will not occur and good Cu pillars can be formed.

The Cu pillar cylindrical preforms of the present invention in a second aspect are made a diameter of 100 μm or more. If the diameter is 100 μm or more, it is easy to make the height of the Cu pillars 200 μm or more. Further, the diameter is made 400 μm or less. Even if the diameter becomes too thick, there is no problem in production of the Cu pillars. While there is no problem in terms of the properties of the Cu pillars, if over 400 μm, the pillars no longer meet the size requirements for Cu pillars for semiconductors.

The Cu pillar cylindrical preforms with a diameter of 100 μm or more of the present invention preferably have a cylinder with a height of 200 to 800 μm. In the past, the Cu pillars were formed by plating, so the time required for production of the Cu pillars was long and the productivity was impaired. If trying to make the height of the Cu pillars higher than the conventional 50 to 60 μm, the time required for production would become even longer. As opposed to this, in the present invention, the material for the Cu pillars is made into cylindrical preforms, so even if increasing the height of the Cu pillars, there is no detrimental effect on the productivity at all. For this reason, by making the Cu pillar cylindrical preforms a shape of a cylinder height of 200 to 800 μm, it is possible to make the cylindrical preforms a diameter of 100 μm or more and thereby secure stability while also enabling the Cu pillars to be made a height of 200 μm or more—not possible in the past. Making the height of the Cu pillars 200 μm or more is preferable for mold-underfill. By making the diameter of the cylindrical preforms thicker within the range of 400 um or less, it is possible to secure the stability of the Cu pillars provided on the semiconductor chip much better and possible to raise the height of the Cu pillars up to 800 μm. Compared with the Cu pillars formed by the conventional plating method, the range of possible variations in the size (diameter and height) of the Cu pillars which can be prepared becomes broader, so the advantageous effect is exhibited that the degree of freedom of design of the semiconductor package greatly increases.

A Cu pillar cylindrical preform of the present invention has Cu as its main component. Here, "has Cu as its main component" means containing components comprised of Cu and unavoidable impurities or components comprised of predetermined elements as explained below and a balance of Cu and unavoidable impurities.

The Cu pillars which had been formed by the conventional plating method contained only Cu since the plating method was used and generally only single substances were deposited or, even when made Cu alloys, they were limited in the components contained and their contents, so the degree of freedom of alloy design was low. As opposed to this, in the present invention, an ingot produced by ingot melting is rolled and drawn to obtain fine wire which is then cut to obtain cylindrical preforms, so it is possible to freely adjust the components at the ingot melting stage. For this reason, there is the effect that it is possible to easily design the alloy components to obtain highly reliable Cu pillars.

A Cu pillar cylindrical preform of the present invention has Cu as its main component and preferably contains one or more of Pd, Pt, Au, and Ni in a total of 0.1 to 4.0 mass % in range. If containing one or more of Pd, Pt, Au, and Ni in a total of 0.1 to 4.0 mass % in range, the effect of control of the mutual diffusion of Cu and Al at the joined interfaces is obtained and the lifetime of the joined part in a PCT test (later explained) performed as a high humidity heating evaluation test is improved. As the evaluation of the joined part here, the electrical resistance is measured after the PCT test and the resin is opened and removed to evaluate the state of breakage of the joined parts by pull tests. Here, if the concentrations of Pd, Pt, Au, and Ni in a Cu pillar cylindrical preform in total are less than 0.1 mass %, the effect of improvement of the reliability of the above PCT test is small and insufficient. On the other hand, if the concentrations of Pd, Pt, Au, and Ni in the Cu pillar cylindrical preform in total exceed 4.0 mass %, the initial joining strength with the Al electrodes falls with low temperature joining, so the long term reliability in the PCT test falls or the mass production margin for joining with BGAs (ball grid arrays), CSP (chip size packages), and other substrates, tapes, etc. becomes smaller. More preferably, the concentrations of Pd, Pt, Au, and Ni in total are 0.5 to 3 mass % in range. If in this range, the reliability in a PCT test is further improved. Note that even though, if the one or more of Pd, Pt, Au, and Ni in total deviate from 0.1 to 4.0 mass % in range, while the above special effect due to containing these components cannot be exhibited, if 5 mass % or less, the basic effect of the present invention can be obtained. Therefore, the present invention prescribed containing one or more of Pd, Pt, Au, and Ni in a total of 5.0 mass % or less in range.

A Cu pillar cylindrical preform of the present invention has Cu as its main component and preferably further contains Ti in 3 to 10 mass ppm. The effect of containing Ti is similar to the above effect of containing Pd, Pt, Au, and Ni. Note that, even though, if the content of Ti deviates from 3 to 10 mass ppm, the above special effect due to containing Ti cannot be exhibited, if 15 mass ppm or less, the basic effect of the present invention can be obtained. Therefore, the present invention prescribed containing Ti in 15 mass ppm or less in range.

A Cu pillar cylindrical preform of the present invention has Cu as its main component and preferably further contains P in 5 to 100 mass ppm. Due to this, it is possible to exhibit the effect of maintaining of the joining strength. Note that even though, if the content of P deviates from 5 to 100 mass ppm, the above special effect due to containing P cannot be exhibited, if 150 mass ppm or less, the basic effect of the present invention can be obtained. Therefore, the present invention prescribed containing P in 150 mass ppm or less in range.

A Cu pillar cylindrical preform of the present invention preferably has a total of the content of S and content of Cl contained as impurities of 1 mass ppm or less. S and Cl by nature corrode Cu, so if the concentrations of contents of these become higher, corrosion of the joined parts is promoted and the joining strength sometimes falls. By making the total of the content of S and the content of Cl 1 mass ppm or less, a drop in the joining strength can be avoided.

A preferable shape of a Cu pillar cylindrical preform of the present invention will be explained next.

The Cu pillar preform 1 of the present invention shown in FIG. 1 preferably has a top surface 11 and a bottom surface 12 with a surface roughness Ra expressing their flatness of 5 µm or less. If the top surface 11 and the bottom surface 12 have a surface roughness Ra of 5 µm or less, when conveying preforms by picking them up at the cut surfaces by vacuum pincettes, they can be conveyed without error. By applying the following method of production of the Cu pillar cylindrical preforms of the present invention for production, it is possible to make the surface roughness Ra of the top surface 11 and the bottom surface 12 5 µm or less.

When cutting Cu pillars with a diameter of 300 µm and a height of 500 µm, it is possible to use dicing blades of various roughnesses to prepare Cu pillars with different surface roughnesses Ra of the cut surfaces, run tests for conveying the preforms by picking them up at the cut surfaces by vacuum pincettes and evaluate if 100 preforms can be conveyed without error. As a result, with a surface roughness Ra of the cut surfaces of 0.8 to 4.8 µm, no pickup error occurs, but if the surface roughness Ra of the cut surfaces is 6.3 µm, the preforms are sometimes dropped due to pickup error.

The angle formed by the top surface 11 and the side surfaces 13 of the Cu pillar preform 1 in the present invention and the angle formed by the bottom surface 12 and the side surfaces 13 of the cylinder (surface angle) are both preferably 88 to 92 degrees. If both of angles formed by the top surface 11 and the bottom surface 12 of the cylinder with the side surfaces 13 (surface angles) are 88 to 92 degrees, when conveying preforms by picking them up at their cut surfaces by vacuum pincettes, it is possible to convey them without error. By applying the method of production of the Cu pillar cylindrical preforms of the present invention, it is possible to make both of the angles formed by the top surface 11 and the bottom surface 12 of the cylinder with the side surfaces 13 (surface angles) 88 to 92 degrees.

When cutting Cu pillars having a diameter of 300 µm and a height of 500 µm, it is possible to deliberately give an angle to the cut surfaces to prepare Cu pillars with surface angles of 90 to 94 degrees, run tests to convey preforms by picking them up at the cut surfaces by vacuum pincettes, and evaluate if it is possible to convey 100 preforms without error. As a result, no errors in pickup occurred with surface angles of 90 and 92 degrees, but when the surface angle was 94 degrees, the pillars sometimes were knocked over due to pickup error.

The method of production of Cu pillar cylindrical preforms of the present invention will be explained next.

Using high purity copper with a Cu purity of 4N to 6N (99.99 to 99.9999 mass %) and adding elements in the necessary concentrations, a copper alloy was prepared by melting. The melting was performed by heating in a vacuum or an atmosphere of nitrogen or Ar gas at 1100° C. or more. After that, the alloy was gradually cooled in the furnace to prepare an ingot. The ingot surface was cleaned by washing by an acid and rinsing by water and then allowed to dry. For analyzing the concentrations of added elements in the Cu, ICP (inductively coupled plasma) analysis etc. is effective.

The ingot was rolled to work it into a wire material. In the rolling process, groove type rolls or swaging etc. were used. When the Cu pillar cylindrical preforms to be produced were supposed to be large in diameter, the next process was proceeded to with the preforms as rolled. When the Cu pillar cylindrical preforms were to be made fine in diameter, they were drawn after being rolled to reduce them to the final wire diameter. In the drawing process, a continuous drawing apparatus enabling a plurality of diamond coated dies to be set was used. In accordance with need, heat treatment was performed at a stage in the middle of the working process or at the final wire diameter. In this way, Cu wire with a diameter of 100 to 400 µm was produced.

The produced wire was cut into predetermined lengths to form the cylindrical preforms. In the cutting, the wire was fixed on a carbon base by wax to enable it to be cut precisely vertically (FIG. 1). For the cutting, a dicer with cutting edges at its outer circumference or a wire saw can be used. After cutting the wire into the target lengths, the wax is melted and the Cu cylindrical preforms are taken out. After that, these were washed by acid and rinsed by water and then allowed to dry. In accordance with need, a rust preventative etc. is coated and allowed to dry.

EXAMPLES

Example 1

Cu cylindrical preforms comprised of the components shown in Table 1 and a balance of Cu and unavoidable impurities were prepared. A copper alloy comprised of high purity copper with a Cu purity of 6N to which other elements are added in the necessary concentrations was prepared by melting, then the alloy was gradually cooled in the furnace to prepare an ingot. The ingot surface was cleaned by washing by acid and rinsing by water and then allowed to dry. ICP analysis was used to measure the contained components.

The ingot was rolled to work it into a wire material which was further drawn to reduce it to the final wire diameter. In the drawing process, a continuous drawing apparatus enabling a plurality of diamond coated dies to be set was used. In accordance with need, heat treatment was performed at a stage in the middle of the working process or at the final wire diameter. In this way, Cu wire with a diameter of 300 µm was produced.

The produced wire was fixed on a carbon base by wax and was cut to lengths of 500 µm by a dicer with cutting edges at its outer circumference. The wax was melted to take out the cylindrical preforms 1. After that, these were washed by acid and rinsed by water and then allowed to dry.

A Si semiconductor chip was used as the semiconductor chip 3, Al electrodes were formed as the electrodes 4 on the semiconductor chip 3, SnAg paste was coated on the end faces of the cylindrical preforms 1, then the cylindrical preforms 1 of the present invention were arranged with their end faces facing the electrodes 4 of the semiconductor chip 3 and the temperature was raised to reflow the SnAg paste 5 to thereby form Cu pillars 2 on the electrodes 4 of the semiconductor chip 3 as shown in FIG. 2A.

As the shear strength measurement samples, as shown in FIG. 2A, samples comprised of the above semiconductor chips on which Cu pillars are formed were used. As the PCT test and TCT test samples, as shown in FIG. 2B, samples obtained by forming solder bumps on the tips of the Cu pillars 2 on the semiconductor chip 3 and connecting the tips of the Cu pillars and electrodes 7 of the semiconductor package 6 through the solder bumps 8 were used. The samples were sealed with resin and supplied to the following reliability tests.

A PCT test (pressure cooker test) was run heating samples to which 40 Cu pillars were connected in advance under saturation type conditions of a high temperature, high humidity environment of a temperature of 121° C., relative humidity of 100%, and 2 atm for 200 and 500 hours. After that, the electrical characteristics of the above 40 connected Cu pillars were evaluated. The results of evaluation were entered in the column of "PCT reliability/Electrical resistance" of Table 1. When the ratio of Cu pillars with electrical resistances raised to 3 times or more the initial values was 30% or more (ratio with respect to 40 pillars, same below), the joined part was defective, so the sample was indicated as poor (P). When the ratio of Cu pillars with electrical resistances raised to 3 times or more was 5% to less than 30%, the sample could be used for ICs with not that stringent reliability requirements, so was indicated as fair (F). When the ratio of Cu pillars with electrical resistances raised to 3 times or more was less than 5% and the ratio of Cu pillars with electrical resistances raised to 1.5 times or more was 5% to less than 30%, the sample was of no problem in practical use, so was indicated as good (G). When the ratio of Cu pillars with electrical resistances raised to 1.5 times or more was less than 5%, the sample was good, so was indicated as very good (VG).

The PCT test was performed by heating for 200 and 500 hours, then opening the resin and removing it, then evaluating 100 Cu pillars for the shear strength of the joined parts. When the ratio of the average value of the shear strength after the PCT test to the average value of the initial shear strength before heating was less than 40%, the reliability was poor, so the sample was indicated as poor (P) in the columns of "Shear strength" at 200 and 500 hours in the "PCT reliability/Shear strength" of Table 1, when the ratio was 40% to less than 60% in range, use was possible for ICs with not that stringent reliability requirements, so the sample was indicated as fair (F), when the ratio was 60% to less than 80%, there was no problem in practical use, so the sample was indicated as good (G), and when the ratio was 80% or more, the PCT reliability was good, so the sample was indicated as very good (VG).

The TCT test was performed using a commercially available TCT test apparatus. Samples on which 400 Cu pillars were connected in advance were used for the test under stringent temperature history conditions (−55° C./30 minutes to 155° C./30 minutes). After the test, the 400 connected Cu pillars were electrically measured and evaluated for electrical conduction. When the defect rate was zero, the reliability was high, so the sample was indicated as very good (VG) in the column "TCT reliability/Electrical characteristics" in Table 1, when the defect rate was less than 2%, it was judged there was no major problem in practical use, so the sample was indicated as good (G), when the defect rate was 2 to 5% in range, the sample was indicated as fair (F), and when the defect rate was over 5%, improvement was required, so the sample was indicated as poor (P).

TABLE 1

| | Components (mass %) | | | | Total of four left | Components (mass ppm) | | | | PCT reliability/ Electrical resistance | | PCT reliability/ Shear strength | | TCT reliability/ electrical charac- teristics |
|---|---|---|---|---|---|---|---|---|---|---|---|---|---|---|
| | Pd | Pt | Au | Ni | | Ti | P | S | Cl | 200 Hr | 500 Hr | 200 Hr | 500 Hr | |
| Ex.1 | | | | | | | | | | VG | G | VG | G | G |
| Ex.2 | 0.08 | | | | 0.08 | | | | | VG | G | VG | G | G |
| Ex.3 | | 0.07 | | | 0.07 | | | | | VG | G | VG | G | G |
| Ex.4 | | | 0.09 | | 0.09 | | | | | VG | G | VG | G | G |
| Ex.5 | | | | 0.08 | 0.08 | | | | | VG | G | VG | G | G |
| Ex.6 | 0.12 | | | | 0.12 | | | | | VG | VG | VG | VG | VG |
| Ex.7 | | 0.13 | | | 0.13 | | | | | VG | VG | VG | VG | VG |
| Ex.8 | | | 0.11 | | 0.11 | | | | | VG | VG | VG | VG | VG |
| Ex.9 | | | | 0.12 | 0.12 | | | | | VG | VG | VG | VG | VG |
| Ex.10 | 0.06 | 0.06 | | | 0.12 | | | | | VG | VG | VG | VG | VG |
| Ex.11 | 0.07 | | 0.05 | | 0.12 | | | | | VG | VG | VG | VG | VG |
| Ex.12 | 0.06 | | | 0.07 | 0.13 | | | | | VG | VG | VG | VG | VG |
| Ex.13 | 0.06 | 0.03 | | 0.03 | 0.12 | | | | | VG | VG | VG | VG | VG |
| Ex.14 | 1.2 | | | | 1.20 | | | | | VG | VG | VG | VG | VG |
| Ex.15 | 3.2 | | | | 3.20 | | | | | VG | VG | VG | VG | VG |
| Ex.16 | 3.9 | | | | 3.90 | | | | | VG | VG | VG | VG | VG |
| Ex.17 | 1.5 | 1.7 | | | 3.20 | | | | | VG | VG | VG | VG | VG |
| Ex.18 | 1.6 | | 2.3 | | 3.90 | | | | | VG | VG | VG | VG | VG |
| Ex.19 | 1.5 | | | 0.5 | 2.00 | | | | | VG | VG | VG | VG | VG |
| Ex.20 | | 2.0 | 1.4 | | 3.40 | | | | | VG | VG | VG | VG | VG |
| Ex.21 | | 1.7 | | 0.9 | 2.60 | | | | | VG | VG | VG | VG | VG |
| Ex.22 | | | 1.5 | 0.8 | 2.30 | | | | | VG | VG | VG | VG | VG |
| Ex.23 | 1.5 | 1.2 | 1.1 | | 3.80 | | | | | VG | VG | VG | VG | VG |
| Ex.24 | 1.5 | 1.1 | 1.1 | 0.1 | 3.80 | | | | | VG | VG | VG | VG | VG |
| Ex.25 | 4.5 | | | | 4.50 | | | | | VG | G | VG | G | G |
| Ex.26 | 3.8 | 0.9 | | | 4.70 | | | | | VG | G | VG | G | G |
| Ex.27 | 3.1 | 0.5 | 0.9 | | 4.50 | | | | | VG | G | VG | G | G |
| Ex.28 | 2.9 | 0.5 | 0.4 | 0.2 | 4.00 | | | | | VG | G | VG | G | G |
| Ex.29 | | | | | | 1 | | | | VG | G | VG | G | G |
| Ex.30 | | | | | | 4 | | | | VG | VG | VG | VG | VG |
| Ex.31 | | | | | | 10 | | | | VG | VG | VG | VG | VG |
| Ex.32 | | | | | | 14 | | | | VG | G | VG | G | G |
| Ex.33 | 0.08 | | | | 0.08 | 5 | | | | VG | VG | VG | VG | VG |
| Ex.34 | | | | | | | 3 | | | VG | G | VG | G | G |
| Ex.35 | | | | | | | 6 | | | VG | G | VG | G | G |
| Ex.36 | | | | | | | 30 | | | VG | G | VG | G | G |
| Ex.37 | | | | | | | 100 | | | VG | G | VG | G | G |
| Ex.38 | | | | | | | 140 | | | VG | G | G | G | G |
| Ex.39 | 0.05 | | | | 0.05 | | 30 | | | VG | G | VG | G | G |
| Ex.40 | | | | | | | | 1.2 | | F | F | F | F | F |
| Ex.41 | | | | | | | | | 1.5 | F | F | F | F | F |
| Ex.42 | 1.5 | | | | 1.50 | | | 1.3 | | G | F | G | F | F |
| Ex.43 | 1.6 | | | | 1.60 | | | | 1.4 | G | F | G | F | F |

The results are shown in Table 1.

Examples 1 to 39 of the present invention were almost all very good (VG) in the electrical resistance and shear strength of the PCT reliability test at 200 hours. Even at 500 hours, good (G) or very good (VG) results were realized. In the TCT reliability test as well, good (G) or very good (VG) results were realized. In Examples 6 to 24, 30, and 31, the totals of Pd, Pt, Au, and Ni or the contents of Ti were in the preferable ranges of the present invention. In the electrical resistance and shear strength of the PCT reliability test, the majority of the examples were very good (VG) at 500 hours. In the TCT reliability test as well, very good (VG) results were achieved.

Examples 40 to 43 of the present invention had total contents of S and Cl outside the preferable ranges of the present invention. The results were fair (F). While the passing levels, the qualities were lower than the other examples.

Example 2

Using the components of Example 1 and the components of Example 23 of Table 1, similar tests were run as in Example 1 while changing the sizes of the Cu pillars to diameters of 50 μm to 400 μm and heights of 100 μm to 800 μm in range.

TABLE 2

| | Components | Pillar shape Diameter (μm) | Height (μm) | Height/diameter ratio | PCT reliability/ Electrical resistance 200 Hr | 500 Hr | PCT reliability/ Shear strength 200 Hr | 500 Hr | TCT reliability/ electrical characteristics |
|---|---|---|---|---|---|---|---|---|---|
| Ex. 44 | Same as Ex. 1 of Table 1 | 50 | 100 | 2.0 | VG | G | VG | G | G |
| Ex. 45 | Same as Ex. 1 of Table 1 | 50 | 200 | 4.0 | VG | G | VG | G | G |
| Ex. 46 | Same as Ex. 1 of Table 1 | 50 | 400 | 8.0 | VG | G | VG | G | G |
| Ex. 47 | Same as Ex. 1 of Table 1 | 75 | 150 | 2.0 | VG | G | VG | G | G |
| Ex. 48 | Same as Ex. 1 of Table 1 | 75 | 300 | 4.0 | VG | G | VG | G | G |
| Ex. 49 | Same as Ex. 1 of Table 1 | 75 | 600 | 8.0 | VG | G | VG | G | G |
| Ex. 50 | Same as Ex. 1 of Table 1 | 100 | 200 | 2.0 | VG | G | VG | G | G |
| Ex. 51 | Same as Ex. 1 of Table 1 | 100 | 400 | 4.0 | VG | G | VG | G | G |
| Ex. 52 | Same as Ex. 1 of Table 1 | 100 | 500 | 5.0 | VG | G | VG | G | G |
| Ex. 53 | Same as Ex. 1 of Table 1 | 100 | 800 | 8.0 | VG | G | VG | G | G |
| Ex. 54 | Same as Ex. 1 of Table 1 | 300 | 500 | | VG | G | VG | G | G |
| Ex. 55 | Same as Ex. 1 of Table 1 | 300 | 800 | | VG | G | VG | G | G |
| Ex. 56 | Same as Ex. 1 of Table 1 | 400 | 800 | | VG | G | VG | G | G |
| Ex. 57 | Same as Ex. 23 of Table 1 | 50 | 100 | 2.0 | VG | VG | VG | VG | VG |
| Ex. 58 | Same as Ex. 23 of Table 1 | 50 | 200 | 4.0 | VG | VG | VG | VG | VG |
| Ex. 59 | Same as Ex. 23 of Table 1 | 50 | 400 | 8.0 | VG | VG | VG | VG | VG |
| Ex. 60 | Same as Ex. 23 of Table 1 | 75 | 150 | 2.0 | VG | VG | VG | VG | VG |
| Ex. 61 | Same as Ex. 23 of Table 1 | 75 | 300 | 4.0 | VG | VG | VG | VG | VG |
| Ex. 62 | Same as Ex. 23 of Table 1 | 75 | 600 | 8.0 | VG | VG | VG | VG | VG |
| Ex. 63 | Same as Ex. 23 of Table 1 | 100 | 200 | 2.0 | VG | VG | VG | VG | VG |
| Ex. 64 | Same as Ex. 23 of Table 1 | 100 | 400 | 4.0 | VG | VG | VG | VG | VG |
| Ex. 65 | Same as Ex. 23 of Table 1 | 100 | 500 | 5.0 | VG | VG | VG | VG | VG |
| Ex. 66 | Same as Ex. 23 of Table 1 | 100 | 800 | 8.0 | VG | VG | VG | VG | VG |
| Ex. 67 | Same as Ex. 23 of Table 1 | 300 | 500 | | VG | VG | VG | VG | VG |
| Ex. 68 | Same as Ex. 23 of Table 1 | 300 | 800 | | VG | VG | VG | VG | VG |
| Ex. 69 | Same as Ex. 23 of Table 1 | 400 | 800 | | VG | VG | VG | VG | VG |

The results are shown in Table 2. Note that Examples 44 to 53 and 57 to 66 are examples corresponding to the invention of claim 4 citing claim 1, so the numerical values of the "height/diameter ratio" are entered, while Examples 54 to 56 and 67 to 69 are examples corresponding to the invention of claim 4 citing claim 2, so the numerical values of the "height/diameter ratio" are not entered.

Examples 44 to 69 of the present invention all realized good (G) or very good (VG) results in the electrical resistance and shear strength of the PCT reliability test and the TCT reliability test.

As a comparative example, a semiconductor chip was formed with a photoresist layer, the photoresist layer was formed with openings of targeted diameters and depths, and the open parts were plated by Cu so as to try to fabricate Cu pillars. In the case of a diameter of the open parts of 50 μm, practical Cu pillars could be fabricated down to depths of 80 μm, but if the depths exceeded 80 μm, sufficient plating solution could no longer circulate and pillars began to become narrower in diameter near the bottom ends. At the depth of 100 μm, it became impossible to fabricate Cu pillars of the targeted diameter. Therefore, with the plating method, in the case of a diameter of 50 μm, it was impossible to fabricate Cu pillars of a height of 100 μm. In the case of a diameter of the open parts of 100 μm, it was possible to fabricate practical Cu pillars up to a depth of 160 μm, but if exceeding a depth of 160 μm, the plating solution could no longer circulate and pillars began to become narrower in diameter near the bottom ends. At the depth of 200 μm, it became impossible to fabricate Cu pillars of the targeted diameter. Therefore, with the plating method, in the case of a diameter of 100 μm, it was impossible to fabricate Cu pillars of a height of 200 μm.

REFERENCE SIGNS LIST 1. cylindrical preform
2. Cu pillar
3. semiconductor chip
4. electrode
5. SnAg paste
6. semiconductor package
7. electrodes
8. older bumps
11. top surface
12. bottom surface
13. side surfaces

The invention claimed is:

1. A Cu pillar for a semiconductor connection consisting of one or more of (b) and (c), and
further containing one or more of (a1), (a2), (a3), and (a4) among
(a1) having one or more of Pt, Au, and Ni in a total of 0.1 to 5.0 mass %,
(a2) having Pd and one or more of Pt, Au, and Ni in a total of 0.1 to 5.0 mass %,
(a3) having Pd in a total of 3.5 to 5.0 mass %,
(a4) having Pd in a total of 0.10 to 0.12 mass %,
(b) having Ti in 3 to 15 mass ppm, and
(c) having P in 5 to 70 mass ppm
and a balance of Cu and unavoidable impurities, having a cylindrical shape with a diameter of 50 to 100 μm, and having a height/diameter ratio of that cylinder of 2.0 or more,
wherein the Cu pillar forms the semiconductor connection in a flip chip device, and
wherein a total of a content of S and a content of Cl contained as impurities is 1 mass ppm or less.

2. A semiconductor chip having the Cu pillar according to claim 1 connected to an electrode on the semiconductor chip.

3. A Cu pillar for a semiconductor connection consisting of one or more of (b) and (c), and
further containing one or more of (a1), (a2), (a3), and (a4) among
(a1) having one or more of Pt, Au, and Ni in a total of 0.1 to 5.0 mass %,
(a2) having Pd and one or more of Pt, Au, and Ni in a total of 0.1 to 5.0 mass %,
(a3) having Pd in a total of 3.5 to 5.0 mass %,
(a4) having Pd in a total of 0.10 to 0.12 mass %,
(b) having Ti in 3 to 15 mass ppm, and
(c) having P in 5 to 70 mass ppm
and a balance of Cu and unavoidable impurities, having a cylindrical shape with a diameter of 100 to 400 μm,
wherein the Cu pillar forms the semiconductor connection in a flip chip device, and
wherein a total of a content of S and a content of Cl contained as impurities is 1 mass ppm or less.

4. The Cu pillar for semiconductor connection according to claim 3, wherein the cylinder has a height of 200 to 800 μm.

5. A semiconductor chip having the Cu pillar according to claim 3 connected to an electrode on the semiconductor chip.

6. A Cu pillar for a semiconductor connection consisting of (b) and optionally containing (c),
(b) having Ti in 3 to 15 mass ppm, and
(c) having P in 100 to 150 mass ppm,
and a balance of Cu and unavoidable impurities, having a cylindrical shape with a diameter of 50 to 100 μm, and having a height/diameter ratio of that cylinder of 2.0 or more,
wherein a total of a content of S and a content of Cl contained as impurities is 1 mass ppm or less and the Cu pillar forms the semiconductor connection in a flip chip device.

7. A semiconductor chip having the Cu pillar according to claim 6 connected to an electrode on the semiconductor chip.

8. A Cu pillar for a semiconductor connection consisting of (b) and optionally containing (c),
(b) having Ti in 3 to 15 mass ppm, and
(c) having P in 100 to 150 mass ppm,
and a balance of Cu and unavoidable impurities, and having a cylindrical shape with a diameter of 100 to 400 μm,
wherein a total of a content of S and a content of Cl contained as impurities is 1 mass ppm or less and the Cu pillar forms the semiconductor connection in a flip chip device.

9. The Cu pillar for semiconductor connection according to claim 8, wherein the cylinder has a height of 200 to 800 μm.

10. A semiconductor chip having the Cu pillar according to claim 8 connected to an electrode on the semiconductor chip.

* * * * *